United States Patent [19]

Pezzani

[11] Patent Number: 6,034,381

[45] Date of Patent: Mar. 7, 2000

[54] NETWORK OF TRIACS WITH GATES REFERENCED WITH RESPECT TO A COMMON OPPOSITE FACE ELECTRODE

[75] Inventor: Robert Pezzani, Parçay-Meslay, France

[73] Assignee: SGS-Thomson Microelectronics S.A., Gentilly, France

[21] Appl. No.: 08/871,734

[22] Filed: Jun. 9, 1997

[51] Int. Cl.[7] .................................................. H01L 29/74
[52] U.S. Cl. ...................... 257/107; 257/115; 257/118; 257/122; 257/123; 257/127; 257/175
[58] Field of Search ................................... 257/107, 115, 257/118, 122, 123, 127, 175

[56] References Cited

U.S. PATENT DOCUMENTS

| 3,409,810 | 11/1968 | Matzen, Jr. | 317/325 |
| 4,613,884 | 9/1986 | Angerstein et al. | 357/39 |
| 4,939,564 | 7/1990 | Asakura et al. | 257/132 |
| 5,345,094 | 9/1994 | Usui et al. | 257/113 |

FOREIGN PATENT DOCUMENTS 0 709 891  5/1996  European Pat. Off. ........ H01L 27/07

OTHER PUBLICATIONS

French Search Report from French Patent Application 96 08300, filed Jun. 28, 1996.

RCA Technical Notes, vol. 2180, No. 1343, Mar. 1984, Princeton, US, pp 1–6, J.M.S. Neilson and R.A. Duclos, "Avalanche Diode Structure".

*Primary Examiner*—Fetsum Abraham
*Attorney, Agent, or Firm*—Wolf, Greenfield & Sacks, P.C.; James H. Morris; Theodore E. Galanthay

[57] ABSTRACT

The present invention relates to a triac network wherein each triac includes an N-type semiconductor substrate, containing a first thyristor comprised of NPNP regions and a second thyristor comprised of PNPN regions, and surrounded with a P-type deep diffusion. A P-type well contains an N-type region, on the front surface side. A first metallization corresponds to a first main electrode, a second metallization corresponds to a second main electrode, a third metallization covers the N-type region and is connected to a gate terminal, and a fourth metallization connects the P-type well to the upper surface of the deep diffusion.

12 Claims, 4 Drawing Sheets

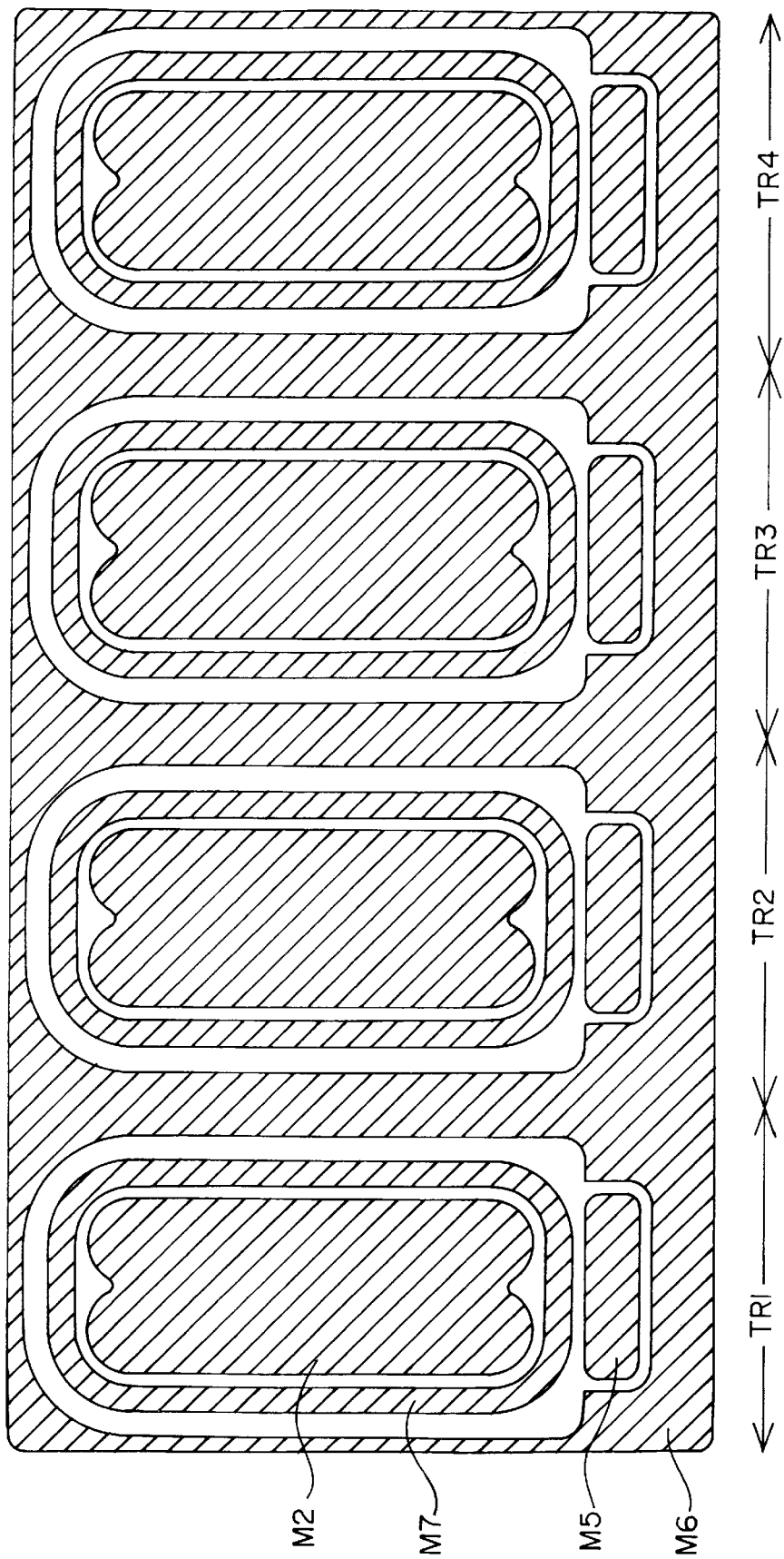

NETWORK OF TRIACS WITH GATES REFERENCED WITH RESPECT TO A COMMON OPPOSITE FACE ELECTRODE

BACKGROUND OF THE INVENTION

1. Field of the Invention

The present invention relates to bidirectional switches, currently called triacs, of medium power.

2. Discussion of the Related Art

Generally, a first surface, or rear surface of a triac is meant to be connected to a radiator (heat sink) and is covered with a uniform metallization forming a first main terminal of the triac. The opposite surface, or front surface, is covered with a second metallization of large dimensions forming the second main terminal of the triac, and one or more secondary metallizations, at least one of which forms a control terminal or gate of the triac.

Generally, the control terminal is referenced with respect to the second main terminal located on the same front surface. This can be a disadvantage, especially when it is desired to implement, monolithically or not, several triacs having a common main terminal (first or second) which is generally connected to ground that are also mounted on a radiator. In such an arrangement, the first main terminals (i.e., those on the rear surface) of the several triacs would be connected together and mounted on a common radiator connected to ground. The gates of the several triacs would then be controlled by a signal that is referenced to the second main terminals (i.e., those on the front surface) which are at high and possibly different potentials. To selectively control the different triacs, a control circuit needs to be provided, the reference voltages of which are high and possibly distinct voltages. Thus, the problem of implementing relatively complex control circuits arises. Alternatively, discrete triacs, having their second main terminals (those on the front surface) commonly connected to ground and having their rear surfaces mounted on a radiator for cooling and being at different potentials (which results in the necessity of providing one radiator per triac or isolated assemblies) have to be used.

This situation appears in a great number of devices. For example, in a washing machine, several triacs are used for controlling the pumps, the solenoid-operated filling valves, the various distributors, etc. Such medium power triacs are controlled by the same programmer unit and their main terminals on which the gates are referenced are interconnected. Since these main terminals are disposed on the same side as the gate, it is not possible to implement a monolithic structure and braze the metallization corresponding to the common terminal on a same radiator, because the gate metallizations disposed on the same surface would then be short-circuited. Such configurations are to be found in many other systems, for example, in controls of rolling shutters in which the engines include a coil for the closing of the shutter and another coil for its opening.

SUMMARY OF THE INVENTION

Thus, an object of the present invention is to provide a triac structure such that several triacs can be assembled in a network with a common electrode, the common electrode forming the reference with respect to which the voltage applied to the control electrode is selected.

Another object of the present invention is to provide such a structure for alternating currents wherein the control voltage always has the same biasing with respect to the common reference main terminal, regardless of the biasing on the other main terminal (positive or negative halfwave of the mains voltage).

Another object of the present invention is to provide a monolithic structure incorporating a triac network.

Another object of the present invention is to provide such a monolithic structure which is easy to manufacture with currently used methods for manufacturing thyristors and triacs.

To achieve these objects, the present invention provides a triac network wherein each triac includes a semiconductor substrate of the first type of conductivity having a front surface and a rear surface, a layer of the second type of conductivity on the rear surface side, a deep diffusion of the second type of conductivity connecting the layer to the front surface, a first well of the second type of conductivity containing a first region of the first type of conductivity on the front surface side, a second well of the second type of conductivity on the front surface side, a second region of the first type of conductivity on the rear surface side substantially facing the second well, and a third well of the second type of conductivity containing a third region of the first type of conductivity on the front surface side. A first metallization on the rear surface side corresponds to a first main electrode, a second metallization on the front surface side covers the upper surface of the first region and of the second well and corresponds to a second main electrode, a third metallization covers one of the third well and the third region and is connected to a gate terminal, and a fourth metallization connects the other of the third well and the third region to the upper surface of the deep diffusion.

According to an embodiment of the present invention, all triacs are formed in a same semiconductor substrate and the first metallization is a common metallization covering the rear surface.

According to an embodiment of the present invention, the deep diffusion extends at the circumference of each triac structure.

According to an embodiment of the present invention, the first type of conductivity is type N.

According to an embodiment of the present invention, the control terminal is connected to the third region, and the network further includes means for applying to this control terminal a negative voltage with respect to the potential of the first main electrode.

According to an embodiment of the present invention, the control terminal is connected to the third well, and the network further includes means for applying to this control terminal a positive voltage with respect to the potential of the first main electrode.

These objects, characteristics and advantages as well as others, of the present invention, will be discussed in detail in the following non-limiting description of specific embodiments in relation with the accompanying drawings.

BRIEF DESCRIPTION OF THE DRAWINGS

FIG. 3B is an elevational view of a triac network structure according to the present invention after performing the metallizations.

DETAILED DESCRIPTION

Figure 1A:
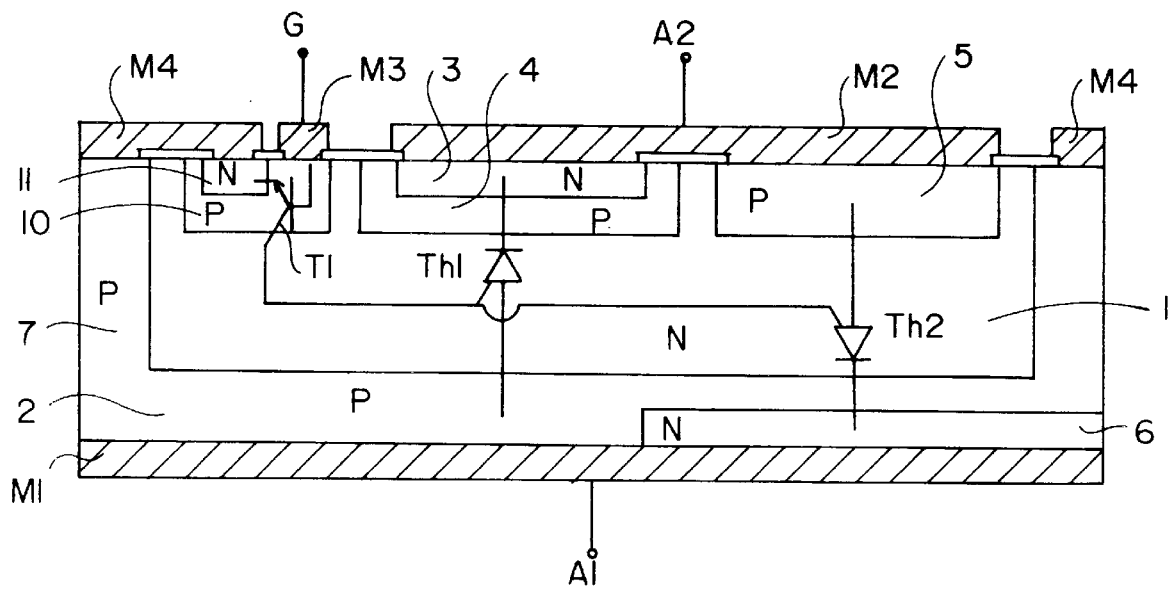
FIG. 1A shows a simplified cross-sectional view of a first embodiment of a triac structure according to the present invention.
Figure 2A:
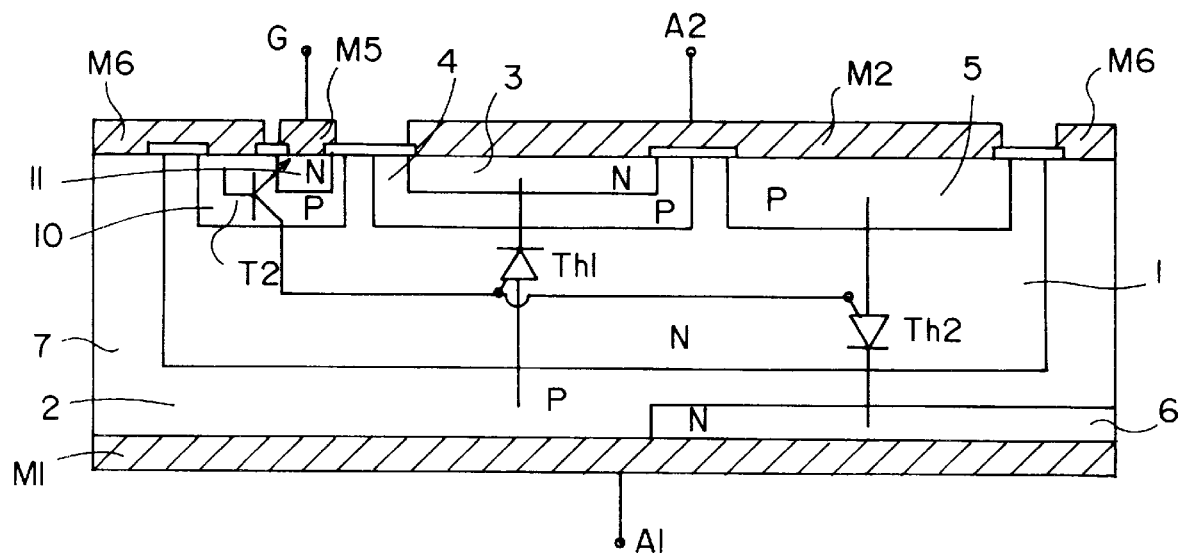
FIG. 2A shows a simplified cross-sectional view of a second embodiment of a triac structure according to the present invention.

As conventionally done in the representation of semiconductor components, the cross-sectional views of FIGS. 1A and 2A are extremely simplified and are not to scale. For an example of a more practical implementation, one should refer to the top views of FIGS. 3A and 3B.

The structure of FIG. 1A is formed based on a lightly doped N-type semiconductor substrate 1. This triac conventionally includes two antiparallel vertical thyristors Th1 and Th2. The anode of thyristor Th1 corresponds to a P-type layer 2 formed on the rear or lower surface side of the substrate. Its cathode corresponds to a region 3 of the second type of conductivity formed on the front or upper surface side in a P-type well 4. The anode of thyristor Th2 corresponds to a P-type well 5 formed on the front or upper surface side and its cathode corresponds to an N-type region 6 formed on the rear or lower surface side in layer 2. This triac is of the so-called well-type, that is, its circumference is comprised of a strongly doped P-type region 7 extending from the front surface to P-type layer 2. Conventionally, region 7 is obtained by deep diffusion from the two surfaces of the substrate. The rear surface is coated with a metallization M1 corresponding to a first main terminal A1 of the triac and the upper surfaces of regions 3 and 5 are coated with a second metallization M2 corresponding to the second main terminal A2 of the triac.

This far, the main aspects of a triac have been described. The present invention differs from other triacs by its triac triggering structure. This triggering structure includes a P-type well 10 formed on the front or upper surface side in which an N-type region 11 is formed.

In the embodiment of FIG. 1A, the surface of well 10 forms one block with a metallization to connected to a gate terminal G of the triac and the surface of region 11 is connected by a metallization M4 to the upper surface of peripheral deep diffusion 7.

In further reference to FIG. 1A, the symbols of different components resulting from the structure shown have also been shown. Thus, above-mentioned thyristors Th1 and Th2 have been shown, as well as a transistor T1, the base of which corresponds to region 10 and to gate metallization G, the emitter of which corresponds to region 11 and metallization M4 (that is, this emitter is connected by well 7 and metallization M4 to the first main electrode A1 of the rear or lower surface of the triac), and the collector of which corresponds to substrate 1, that is, to the anode gate regions of thyristors Th1 and Th2.

Figure 1B:
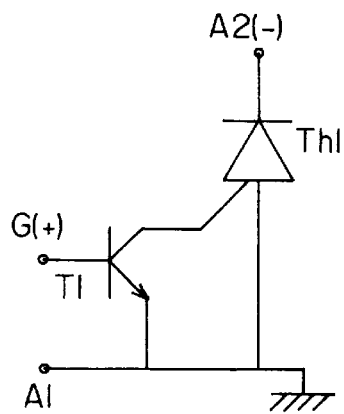
FIG. 1B shows an equivalent diagram of the first embodiment when the main front surface terminal is at a lower potential than the main rear surface terminal.

The triac operates as follows. When terminal A2 is negative with respect to terminal A1, thyristor Th1 can be turned on. The equivalent diagram is then that of FIG. 1B. If a positive voltage with respect to that of rear or lower surface electrode A1 is applied to terminal G, for example, a voltage of approximately 6 volts, a current flows between terminals G and A1 through the base-emitter junction of transistor T1. This base-emitter current causes the flowing of a collector-emitter current through transistor T1 and thus the flowing of a current between the anode and the anode gate of thyristor Th1 which is then turned on. Another explanation for the turning-on of thyristor Th1 is the fact that the base-emitter junction of transistor T1 becoming conductive results in the generation of charges in the vicinity of the junction between substrate 1 and region 4, that is, a turning-on of thyristor Th1 by unblocking its blocking junction between substrate 1 and region 4.

Figure 1C:
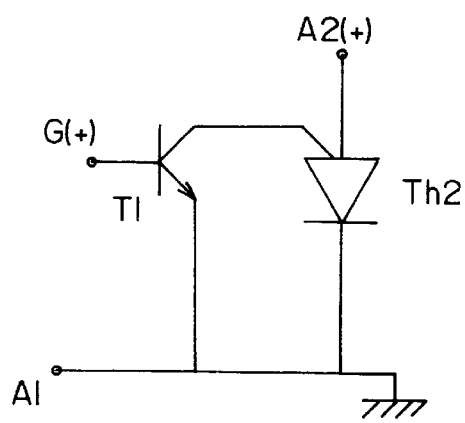
FIG. 1C shows an equivalent diagram of the first embodiment when the main front surface terminal is at a higher potential than the main rear surface terminal.

When terminal A2 is positive with respect to terminal A1, thyristor Th2 can be turned on. The equivalent diagram is then that of FIG. 1C. If a positive voltage with respect to that of rear or lower surface electrode A1 is applied to terminal G, for example, a voltage of approximately 6 volts, a current flows between terminals G and A1 through the base-emitter junction of transistor T1. This transistor becomes conductive and a current flows from terminal A2, via the anode/anode gate junction of thyristor Th2, and then through transistor T1, to terminal A1. In this case, transistor T1 operates normally (i.e., as an amplifier) and the anode gate current is substantially equal to the injected base current multiplied by the transistor gain.

Thus, a triac structure in which the control electrode G is disposed on the front surface but in which the triac is triggered by applying on terminal G a voltage having a given polarity (positive) with respect to the voltage of the rear surface electrode (A1) is obtained.

FIG. 2A shows a simplified cross-sectional view of a second embodiment of the present invention. The structure of the different areas formed in the semiconductor substrate is identical to that illustrated in FIG. 1A. The difference between the two drawings is that region 11 is connected to a metallization M5 connected to gate G and that well 10 is connected by a metallization M6 to peripheral deep diffusion 7.

Thus, a NPN-type transistor T2 is formed, the emitter of which corresponds to region 11 and is connected by metallization M5 to gate G, the base of which corresponds to well 10 and is connected by metallization M6 and deep diffusion 7 to terminal A1, and the collector of which corresponds to substrate 1, that is, to the anode gates of thyristors Th1 and Th2.

The operation of this second embodiment of the present invention will be described in relation with FIGS. 2B and 2C which show equivalent diagrams in the case where terminal A2 is negative with respect to terminal A1, for example at ground, and in the case where terminal A2 is positive with respect to terminal A1, respectively.

Figure 2B:
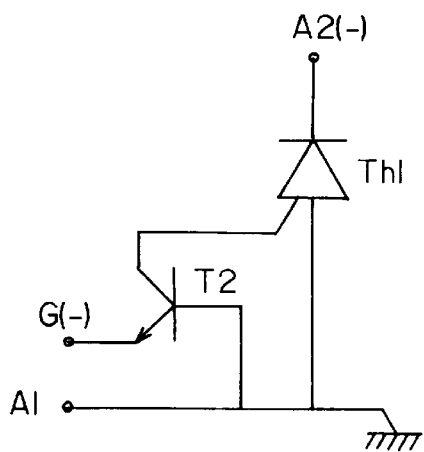
FIG. 2B shows an equivalent diagram of the second embodiment when the main front surface terminal is at a lower potential than the main rear surface terminal.

As is shown in FIG. 2B, if, while terminal A2 is negative with respect to terminal A1, a negative voltage is applied to the gate, the base-emitter junction of transistor T2 becomes conductive and makes the transistor T2 conductive. As a result, a current flows from terminal A1 to the anode/anode gate junction of thyristor Th1 and, via transistor T2, to gate terminal G. Transistor T2 normally operates as an amplifier.

Figure 2C:
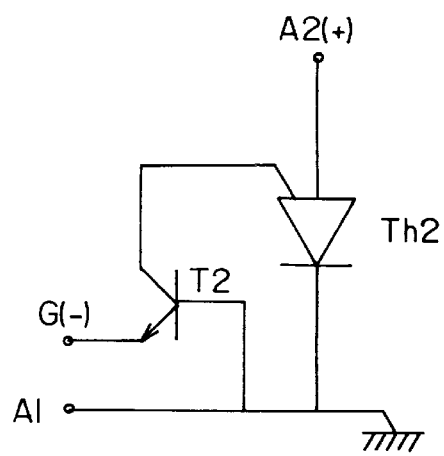
FIG. 2C shows an equivalent diagram of the second embodiment when the main front surface terminal is at a higher potential than the main rear surface terminal.

Similarly, in the case of FIG. 2C where terminal A2 is positive with respect to terminal A1, the application of a negative voltage on terminal G makes transistor T2 conductive by circulating a base-emitter current, after which a current flows from terminal A2 to the anode/anode gate junction of thyristor Th2, and then through transistor T2 to terminal G. Transistor T2 also normally operates as an amplifier.

In practice, this second embodiment of the present invention, where, in both cases, transistor T2 operates as an amplifier and where the control is more sensible, is preferred. This has been established by way of experiment by the present inventor.

As indicated previously, an aim of the present invention is to implement triacs which can be assembled in a network of triacs, each of which is connected to the others by way of a surface which is opposite to the surface upon which the gate metallization is formed. This is precisely what the present invention obtains.

Several primary triacs such as that of FIG. 1A or 2A can be assembled by brazing of their metallizations M1 on a same grounded radiator or, preferably, several triacs such as that of FIG. 1A or 2A can be implemented monolithically in a same semiconductor substrate.

Figure 3A:
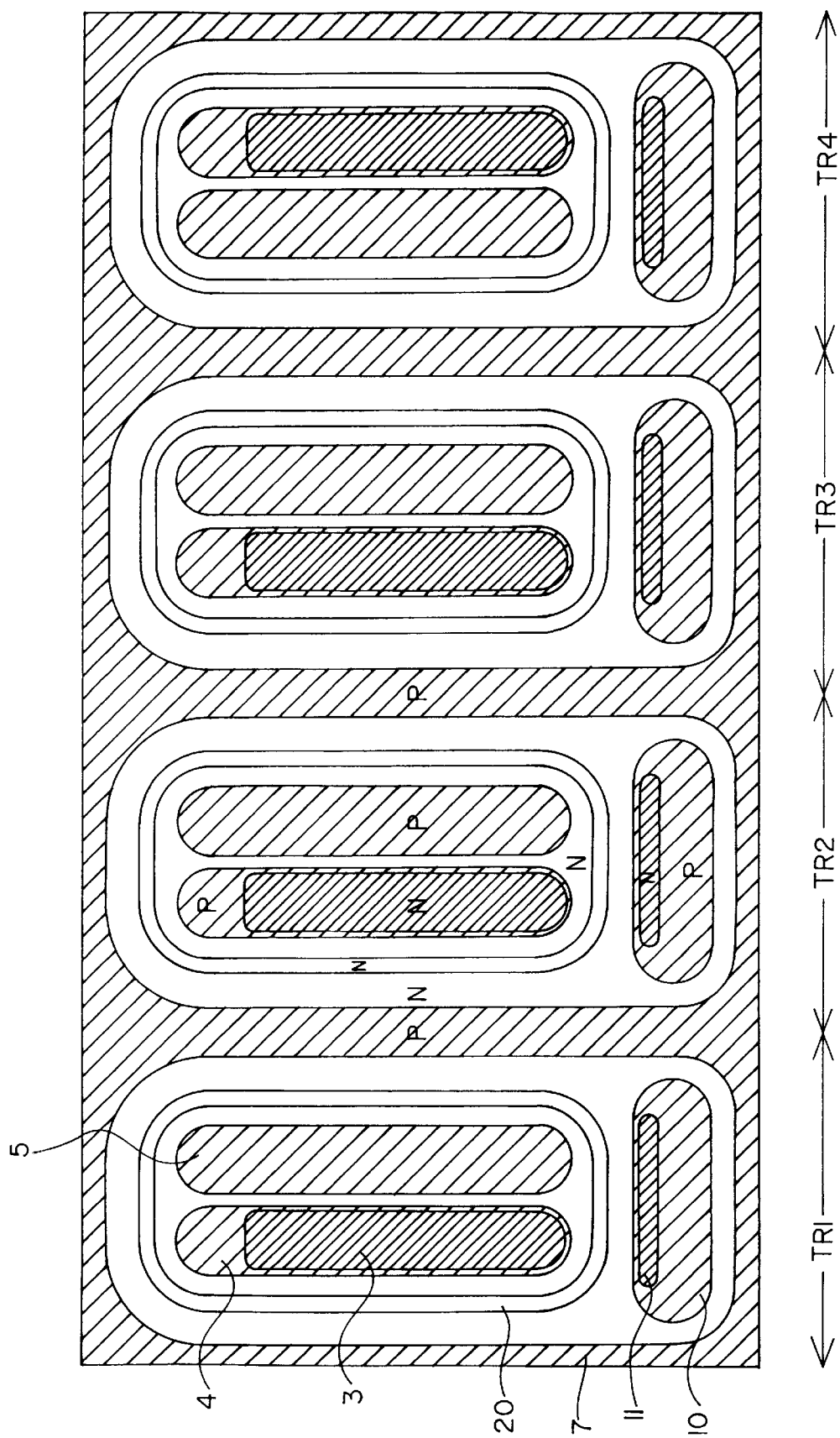
FIG. 3A is an elevational view of a triac network structure according to the present invention before performing the metallizations.

FIGS. 3A and 3B show an example of a top view of a network of triacs, each of which corresponds to the triac of FIG. 2A, and assembled according to an embodiment of the present invention. FIG. 3A is a top view before performing any metallization, and FIG. 3B is a top view illustrating the metallizations. In FIGS. 3A and 3B, four triacs TR1, TR2, TR3, and TR4 are assembled side-to-side in a same substrate. In these drawings, the same components as in FIG. 2A have been referred to by the same references.

It should be noted that regions 3, 4, and 5 have elongated and parallel shapes. An N+-type ring 20 conventionally is formed at the circumference of P wells 4 and 5 to be used as a channel stop and is coated with a metallization M7 (as depicted in FIG. 3B). This metallization M7 constitutes an equipotential plate fixing the fields on the surface.

Of course, the present invention is likely to have various alterations, modifications, and improvements which will readily occur to those skilled in the art. For example, the types of conductivity could be inverted with the biasing being modified accordingly. Furthermore, the various improvements generally used in the structures of the individual thyristors of a triac could be performed, for example the providing of emitter short-circuit areas (emitter shorts).

It should also be noted that, preferably, cathode region 6 of thyristor Th2 extends laterally beyond the projection of region 5 to avoid a desensitizing of the thyristor.

Such alterations, modifications, and improvements are intended to be within the spirit and the scope of the present invention. Accordingly, the foregoing description is by way of example only and is not intended to be limiting. The present invention is limited only as defined in the following claims and the equivalents thereto.

What is claimed is:

1. A triac network wherein each triac includes:
   a semiconductor substrate of the first type of conductivity having a front surface side and a rear surface side;
   a layer of the second type of conductivity on the rear surface side;
   a deep diffusion of the second type of conductivity connecting the layer to the front surface side;
   a first well of the second type of conductivity on the front surface side, the first well containing a first region of the first type of conductivity;
   a second well of the second type of conductivity on the front surface side;
   a second region of the first type of conductivity on the rear surface side, the second region substantially facing the second well;
   a third well of the second type of conductivity on the front surface side, the third well containing a third region of the first type of conductivity;
   a first metallization on the rear surface side corresponding to a first main electrode;
   a second metallization on the front surface side covering an upper surface of the first region and an upper surface of the second well, and corresponding to a second main electrode;
   a third metallization covering one of the third well and the third region, the third metallization being connected to a gate terminal; and
   a fourth metallization connecting the other one of the third well and the third region that is not covered by the third metallization to an upper surface of the deep diffusion.

2. The triac network of claim 1, wherein each triac is formed in a same semiconductor substrate and wherein the first metallization is a common metallization covering the rear surface side of each triac.

3. The triac network of claim 2, wherein the third metallization covers the third region and connects the gate terminal to the third region, the triac network terminal further including means for applying to the gate terminal a negative voltage with respect to a potential of the first main electrode.

4. The triac network of claim 2, wherein the third metallization covers the third well and connects the gate terminal to the third well, the triac network further including means for applying to the gate terminal a positive voltage with respect to a potential of the first main electrode.

5. The triac network of claim 1, wherein the deep diffusion extends past the circumference of each triac.

6. The triac network of claim 1, wherein the first type of conductivity is type N.

7. The triac network of claim 1, wherein the third metallization covers the third region and connects the gate terminal to the third region, the triac network terminal further including means for applying to the gate terminal a negative voltage with respect to a potential of the first main electrode.

8. The triac network of claim 1, wherein the third metallization covers the third well and connects the gate terminal to the third well, the triac network further including means for applying to the gate terminal a positive voltage with respect to a potential of the first main electrode.

9. A monolithic switching component having a first surface and a second surface opposing the first surface, the switching component comprising:
   a first switch having a first terminal disposed on the first surface of the switching component to receive a first voltage potential, a second terminal disposed on the second surface of the switching component to receive a second voltage potential, and a third terminal disposed on the second surface of the switching component, the first switch including first and second thyristors each having an anode, a cathode, and a gate, the anode of the first thyristor and the cathode of the second thyristor being electrically coupled to the first terminal of the first switch, the cathode of the first thyristor and the anode of the second thyristor being electrically coupled to the second terminal of the first switch, and the gate of the first thyristor being electrically coupled to the gate of the second thyristor;
   a second switch having a first terminal disposed on the first surface of the switching component and electrically coupled to the first terminal of the first switch to receive the first voltage potential, a second terminal disposed on the second surface of the switching component to receive a third voltage potential, and a third terminal disposed on the second surface of the switching component, the second switch including third and fourth thyristors each having an anode, a cathode, and a gate, the anode of the third thyristor and the cathode of the fourth thyristor being electrically coupled to the first terminal of the second switch, the cathode of the third thyristor and the anode of the fourth thyristor being electrically coupled to the second terminal of the second switch, and the gate of the third thyristor being electrically coupled to the gate of the fourth thyristor;

first means, electrically coupled to the first and third terminals of the first switch and the gates of the first and second thyristors, for initiating conduction between the first and second terminals of the first switch independently of the second voltage potential; and second means, electrically coupled to the first and third terminals of the second switch and the gates of the third and fourth thyristors, for initiating conduction between the first and second terminals of the second switch independently of the third voltage potential.

10. The monolithic switching component of claim 9, wherein the first means initiates conduction between the first and second terminals of the first switch in response to a first voltage potential difference between the third terminal of the first switch and first voltage potential.

11. The monolithic switching component of claim 10, wherein the second means initiates conduction between the first and second terminals of the second switch in response to a second voltage potential difference between the third terminal of the second switch and the first voltage potential, the second voltage potential difference being approximately equal to the first voltage potential difference.

12. The monolithic switching component of claim 9, wherein:

the first means includes a first transistor having a base that is electrically coupled to the first terminal of the first switch, a collector that is electrically coupled to the gates of the first and second thyristors, and an emitter that is electrically coupled to the third terminal of the first switch; and wherein the second means includes a second transistor having a base that is electrically coupled to the first terminal of the second switch, a collector that is electrically coupled to the gates of the third and fourth thyristors, and an emitter that is electrically coupled to the third terminal of the second switch.

* * * * *

UNITED STATES PATENT AND TRADEMARK OFFICE
CERTIFICATE OF CORRECTION

PATENT NO. : 6,034,381
DATED : March 7, 2000
INVENTOR(S) : Robert Pezzani

It is certified that error appears in the above-identified patent and that said Letters Patent is hereby corrected as shown below:

Title page,
Item [30], should read as follows:

[30] Foreign Application Priority Data

June 28, 1996 [FR] France .................................... 96 08300

Claims 3 and 7,
Line 3, immediately after "network," please delete "terminal".

Signed and Sealed this

Eleventh Day of December, 2001

Attest:

NICHOLAS P. GODICI
Attesting Officer    Acting Director of the United States Patent and Trademark Office